United States Patent [19]

Iizuka et al.

[11] Patent Number: 5,182,763
[45] Date of Patent: Jan. 26, 1993

[54] REFLECTION DEVICE

[75] Inventors: Takashi Iizuka, Atsugi; Yutaka Watanabe, Isehara; Yasuaki Fukuda, Hadano, all of Japan

[73] Assignee: Canon Kabushiki Kaisha, Tokyo, Japan

[21] Appl. No.: 888,275

[22] Filed: May 26, 1992

Related U.S. Application Data

[63] Continuation of Ser. No. 767,364, Sep. 30, 1991, abandoned, which is a continuation of Ser. No. 633,957, Dec. 26, 1990, abandoned.

[30] Foreign Application Priority Data

Dec. 28, 1989 [JP] Japan ................... 1-344842

[51] Int. Cl.$^5$ ............................................. G21K 5/10
[52] U.S. Cl. .............................. 378/34; 378/84; 378/145
[58] Field of Search ................. 378/34, 84, 85, 82, 378/20, 49, 145

[56] References Cited

U.S. PATENT DOCUMENTS

| | | | |
|---|---|---|---|
| 4,429,411 | 1/1984 | Smither | 378/84 |
| 4,698,833 | 10/1987 | Keen et al. | 378/84 |
| 4,714,308 | 12/1987 | Sawamura et al. | 350/1.7 |
| 4,785,470 | 11/1988 | Wood et al. | 378/84 |
| 4,882,780 | 11/1989 | Wittny | 378/84 |
| 4,916,721 | 4/1990 | Carr et al. | 378/84 |
| 4,969,175 | 11/1990 | Nelson et al. | 378/84 |
| 5,052,033 | 9/1991 | Ikeda et al. | 378/35 |

FOREIGN PATENT DOCUMENTS

| | | |
|---|---|---|
| 0083394 | 7/1983 | European Pat. Off. |
| 0238416 | 9/1987 | European Pat. Off. |
| 62-242901 | 10/1987 | Japan . |
| 63-61200 | 3/1988 | Japan . |

OTHER PUBLICATIONS

Patent Abstracts of Japan, Kokai No. 59-220707, vol. 9, No. 93, Apr. 1985.
Fujii, et al., "A Computer-Controlled System for an Oscillation Mirror and Exposure Shutter," Summ. of Japanese Appl. Phys., Spring 1988, 31a-k-9.

*Primary Examiner*—David P. Porta
*Attorney, Agent, or Firm*—Fitzpatrick, Cella, Harper & Scinto

[57] ABSTRACT

Disclosed are a reflection mirror for reflecting a received radiation beam to produce a reflection beam, a reflection device with such a mirror, a scanning system with such a mirror and an exposure apparatus with such a mirror. A radiation beam is inputted to the reflection mirror with an angle of incidence which changes with position on the reflection mirror, wherein the reflection mirror has a multilayered film effective to provide an increased relative reflectivity with respect to a predetermined wavelength of the reflection beam, and wherein a layer of the multilayered film has a thickness which changes with position so as to substantially avoid a shift of the wavelength of the reflection beam dependent upon the angle of incidence.

32 Claims, 3 Drawing Sheets

REFLECTION DEVICE

This application is a continuation of prior U.S. patent application Ser. No. 07/767,364 filed Sep. 30, 1991, which application is a continuation of prior U.S. patent application Ser. No. 07/633,957 filed Dec. 26, 1990, both now abandoned.

FIELD OF THE INVENTION AND RELATED ART

This invention relates generally to a reflection device with a mirror having a multilayered film. In another aspect, the invention relates to a scanning system or an exposure apparatus with such a reflection device.

More particularly, the invention is concerned with a reflection device with a mirror having a multilayered film, effective to reflect light of a wavelength 200 nm or less, such as X-rays, vacuum ultraviolet rays or the like, to produce expanded or diffused reflection light. In another aspect, the invention is concerned with a scanning system or an exposure apparatus with such a reflection device.

Conventionally, for reflection of light of a wavelength 200 nm or less, having a small divergent angle, such as X-rays or vacuum ultraviolet rays, for example, and for enlarging the diameter of the light, a fixed convex mirror or a swingingly moved convex or flat mirror is used. If, when such a mirror is used, it is desired to provide an increased reflectivity with respect to a particular wavelength, as compared with the other wavelengths, it may be considered that a multilayered film designed with respect to the particular wavelength may be formed on the mirror surface. However, the provision of such a multilayered film on the mirror surface involves such problems as follows.

In a fixed convex mirror, different portions of light inputted to the reflection surface of the mirror impinge on different positions on the convex reflection surface of the mirror. As a result, at these positions, the inputted light rays have different angles (angles of incidence) with respect to the reflection surface. On the other hand, generally a multilayered film is so optimized that it exhibits its performance when light of a predetermined wavelength is inputted thereto with a predetermined angle (angle of incidence). Accordingly, in the case of the fixed convex mirror, there is a possibility that, with regard to the predetermined wavelength, only the reflection light rays produced around the peak of the mirror, for example, have intensified strength (as compared with the other wavelengths), and those reflection light rays produced by the other portions of the mirror have intensified strength with respect to some wavelength other than the predetermined wavelength.

If this occurs, then the reflection light produced by this mirror has spatial non-uniformness in wavelength, in its section.

In a swingable mirror, on the other hand, the inclination of the reflection surface to the light inputted thereto changes with time. As a result, the angle of incidence of the light with respect to the reflection surface also changes with time. This leads to a situation that, in the produced reflection light with which a surface to be illuminated is scanned, such a light component as having a relatively strong light intensity has a varying wavelength.

When such a fixed mirror or a swingable mirror is used in an illumination system of an X-ray exposure apparatus, for example, to expose a semiconductor wafer with X-rays reflected by this mirror, since generally the sensitivity of a resist applied to the wafer has a dependence upon the wavelength, the non-uniformness in wavelength or the variation in wavelength such as described above presents uniform exposure.

SUMMARY OF THE INVENTION

It is accordingly a primary object of the present invention to provide an improved reflection mirror which is free from the above-described inconveniences.

It is another object of the present invention to provide a reflection device with such a reflection mirror.

It is a further object of the present invention to provide a scanning system with such a reflection device.

It is yet another object of the present invention to provide an exposure apparatus with such a reflection device.

In accordance with an aspect of the present invention, there is provided a fixed or swingable reflection mirror for reflecting a received radiation beam to produce a reflection beam, wherein the radiation beam is inputted to said reflection mirror with an angle of incidence which changes with position on said reflection mirror, characterized in that: said reflection mirror has a multilayered film effective to provide an increased relative reflectivity with respect to a predetermined wavelength of the reflection beam, wherein a layer of said multilayered film has a thickness which changes with position so as to substantially avoid a shift of said wavelength of the reflection beam dependent upon the angle of incidence.

In accordance with another aspect of the present invention, there is provided a reflection device including a movable mirror for reflecting a received radiation beam to produce a reflection beam, wherein said movable mirror is so moved that, with respect to a plane of incidence of the radiation beam, a position and an angle of incidence of the radiation beam are shifted with the movement of said movable mirror, characterized in that: said movable mirror has a multilayered film effective to provide an increased relative reflectivity of a predetermined wavelength of the reflection beam, wherein each layer of said multilayered film has a thickness which changes with position so as to substantially avoid a shift of said wavelength with the shift in the angle of incidence of the radiation beam.

In accordance with a further aspect of the present invention, there is provided a scanning system, comprising: a radiation source; a reflection mirror for reflecting a radiation beam from said radiation source to produce a reflection beam, said reflection mirror having a multilayered film effective to provide an increased relative reflectivity with respect to a predetermined wavelength of the reflection beam, wherein a layer of said multilayered film has a thickness which gradually increases with an increase in a distance from said radiation source in a plane of incidence of the radiation beam; and a driving device for swinging said reflection mirror so as to shift a position and an angle of incidence of the radiation beam upon said reflection mirror, in the plane of incidence of the radiation beam, to thereby scanningly deflect the reflection beam.

In accordance with yet another aspect of the present invention, there is provided an exposure apparatus having a reflection mirror for reflecting a received radiation beam to produce a reflection beam, to expose a substrate with the reflection beam, wherein the radiation beam is inputted to said reflection mirror with an angle of incidence which changes with position on said reflection mirror, characterized in that: said reflection mirror has a multilayered film effective to provide an increased relative reflectivity with respect to a predetermined wavelength of the reflection beam, wherein each layer of said multilayered film has a thickness which changes with position so as to substantially avoid a shift of said wavelength of the reflection beam dependent upon the angle of incidence.

In this type of exposure apparatus, said reflection mirror may be fixed or swingingly moved.

In accordance with a still further aspect of the present invention, there is provided an X-ray exposure apparatus, comprising: an X-ray source; and an illumination system for illuminating a mask pattern with X-rays from said X-ray source to expose a wafer to the mask pattern; wherein said illumination system includes a reflection mirror for reflecting the X-rays from said X-ray source to produce a reflection beam and a driving device for swinging said reflection mirror; wherein said reflection mirror has a multilayered film effective to provide an increased relative reflectivity with respect to a predetermined wavelength of the reflection beam; wherein each layer of said multilayered film of said reflection mirror has a thickness which gradually increases with an increase in a distance from said X-ray source in a plane of incidence of the X-rays; and wherein said driving device swings said reflection mirror so as to shift a position and an angle of incidence of the X-rays upon said reflection mirror in the plane of incidence, to thereby scanningly deflect the reflection beam to scan the mask pattern with the deflected reflection beam.

In the present invention, as the reflection mirror, one having a flat reflection surface, one having a concave reflection surface or one having a convex reflection surface may by used.

In one preferred form of the present invention, the mirror has a flat reflection surface and the driving device rotationally moves the reflection mirror through a rotational shaft space from the reflection surface. In another preferred form, the reflection mirror has a convex reflection surface and the driving device rotationally moves the reflection mirror through a rotational shaft spaced from the reflection surface or, alternatively, the driving device oscillatingly moves the reflection mirror in a direction traversing the radiation beam.

Preferably, in the present invention, the reflection mirror is disposed so that the radiation beam such as X-rays is grazingly inputted (at a certain grazing angle) to the reflection surface thereof, so as to ensure enhanced reflectivity.

It is to be noted here that the term "plane of incidence" means a plane that contains the radiation beam inputted to the reflection surface of the reflection mirror and the reflection beam produced by this reflection surface.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
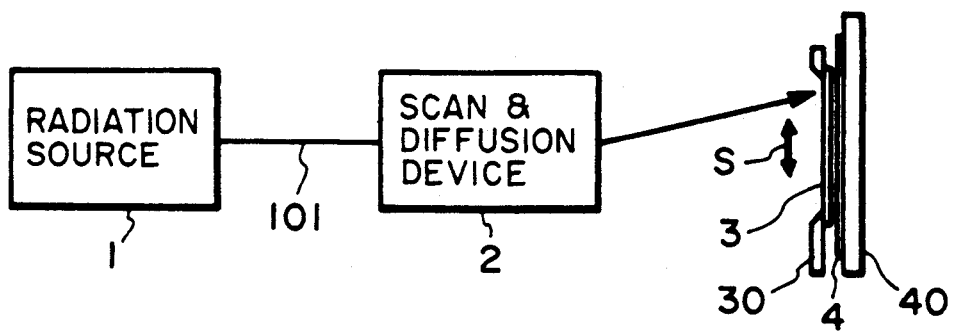
FIG. 1 is a schematic and diagrammatic view of an exposure apparatus according to an embodiment of the present invention.

Referring to FIG. 1, showing an exposure apparatus according to an embodiment of the present invention, denoted at 1 is a radiation source such as an X-ray source, for example, adapted to produce a radiation beam such as X-rays, for example, which contains different wavelengths and which has a relatively wide bandwidth and a relatively small divergent angle. Denoted at 2 is a scan and diffusion device having a swingable mirror; at 3 is a mask on which a circuit pattern is formed; at 4 is a semiconductor wafer having a resist applied to the surface thereof; at 30 is a mask stage for holding the mask 3; and at 40 is a wafer stage for holding the wafer 4. The radiation source 1, the scan and diffusion device 2 and the stages 30 and 40 are disposed along a horizontal axis.

The scan and diffusion device 2 is arranged to reflect the X-ray beam 101 with its mirror and to scanningly deflect the X-ray beam in a direction or directions as denoted by a double-head arrow S in FIG. 1. In this manner, it produces a diffused X-ray beam (reflection beam) with which the mask 3 is illuminated and, thus, the resist of the wafer 4 is exposed to the mask pattern with the X-ray beam. Although not shown in FIG. 1, the X-ray beam is propagated within a tube or a chamber the inside of which is evacuated. If desired, the inside of such a tube or a chamber is filled with He gas, for example.

The swingable mirror of the scan and diffusion device 2 has a substrate and a reflection film formed on the substrate, and the reflection film is provided by a multilayered film. Each layer constituting the multilayered film has a thickness which gradually increases with an increase in the distance from the radiation source 1, in the plane of incidence of the radiation beam (X-ray beam) 101.

In designing such a mirror, first the angle of incidence of the radiation beam such as the X-ray beam 101 to the mirror (reflection surface) is taken into account, and the necessary angle of swinging movement of the mirror is determined in accordance with the size of a required illumination zone. Then, the optimum multilayered structure of the reflection film is determined.

As for the material of the substrate of the reflection mirror, silica ($SiO_2$) may be the best, particularly in light of the lapping precision and the like. However, any other material may be used. For example, silicon carbide (SiC) or other metal materials may be used.

Typically, the multilayered structure film comprises alternately accumulated different-material layers. As regard the materials, preferably two different materials having a large difference in the real portion of the complex index of refraction, with respect to the wavelength of X-rays in question, but having small imaginary portions of the complex index of refraction, may be selected. For the method of formation of such a film, a high frequency magnetron sputtering method or an ion beam sputtering method, for example, is effective. However, any other method such as any one of various sputtering methods, electron beam deposition methods, chemical vapor deposition methods, for example, is usable.

In order to ensure a continuous change in the period of the multilayered film (i.e. the thickness of each layer), during the film formation, a method wherein a shutter means is disposed before the substrate and the open time period of the shutter is controlled, can be used. More specifically, a shutter means is disposed before the substrate surface on which the film is to be formed, and the opening of a shutter blade of the shutter means is initiated from that side of the substrate surface at which a larger thickness film is to be formed. The opening movement of the shutter blade is made continuously. By repeating such an operation for all the layers to be formed, the resultant multilayered film has a continuously changing period (film layer thickness). However, the film forming method is not limited to this, and any other method may be used.

Figure 2:
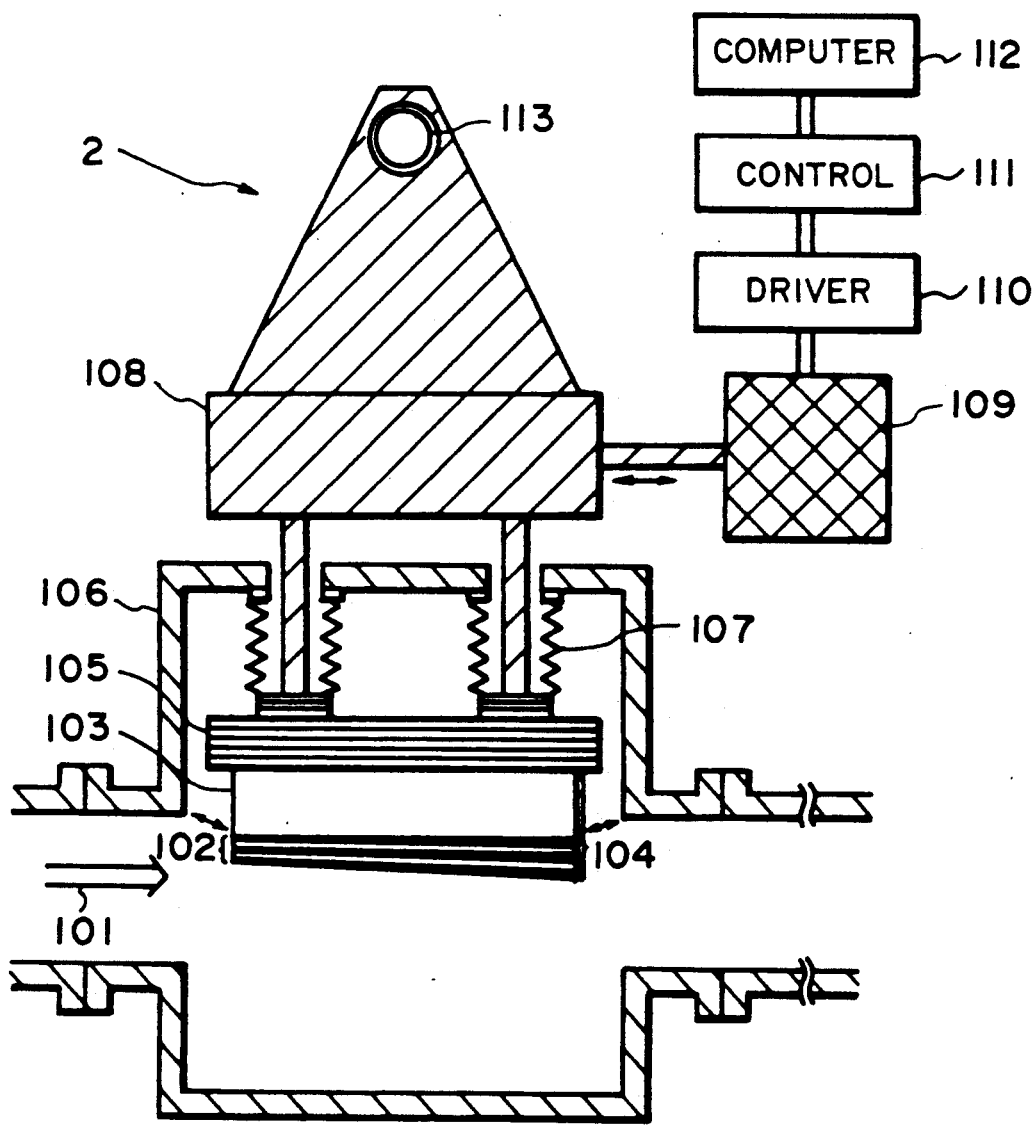
FIG. 2 is a schematic and diagrammatic view of a scanning system shown in FIG. 1.

FIG. 2 shows details of an example of a scan and diffusion device 2 of the FIG. 1 embodiment. In this example, the device 2 has a reflection mirror 104 having a substrate with a flat surface on which a multilayered film is formed. More particularly, the surface of the substrate 103 is finished by lapping and a multilayered film 102 is formed on this surface. In the horizontal direction along the surface of the substrate 103, the multilayered film 102 has a continuously changing period. More specifically, each layer of the multilayered film 102 has a thickness which increases linearly, in a direction from the X-ray beam input side toward the output side. Here, the thickness of each layer at a given point on the substrate 103 surface is determined so that a quantity "d x $\sin\theta_x$" is maintained substantially constant, where $\theta_x$ is the angle of incidence of the X-ray beam 101 which changes with the angular position of the mirror 104 and d is the thickness at a particular position within the section of the input X-ray beam 101 (for example, at the center of the section of the X-ray beam).

In this example, the mirror swinging mechanism is such as illustrated, and it comprises an actuator 109, a driver 110, a controller 111 and a system control computer 112, wherein the actuator 110 is driven through the system control computer 112, the controller 111 and the driver 110. By this drive, a movable portion 108 of the actuator is swingingly moved along an arcuate path, about a rotational shaft 113, whereby the mirror 104 which is held by a base holder 105 and placed within a chamber 106 is swingingly moved along an arcuate path, about the shaft 113. Denoted at 107 are bellows for intercepting the inside of the chamber 106 from the driving part (108, 109 and 113) and to sealingly close the chamber 106.

The swinging mechanism is not limited to this, and any one that can swing the mirror 104 is usable. An example is that: a supporting means for supporting the mirror is provided, and a driving means is coupled to the mirror or the supporting means to drive the same. The illustrated example has a computer-control function.

Figure 3:
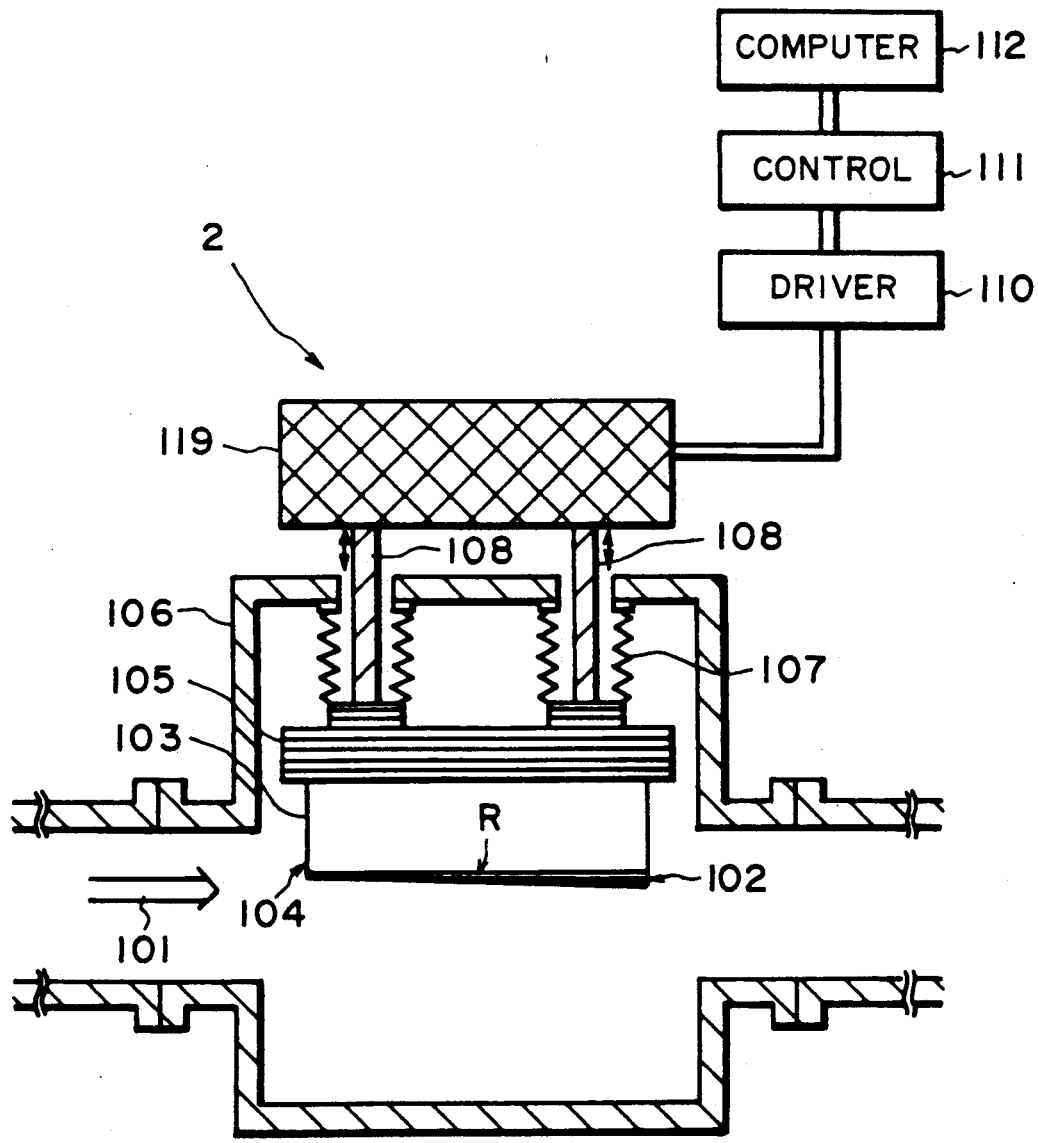
FIG. 3 is a schematic and diagrammatic view of another example of a scanning system usable in the exposure apparatus of FIG. 1.

Another form of the scan and diffusion device 2 is illustrated in FIG. 3. In FIG. 3, like numerals as those of FIG. 2 are assigned to similar elements. Denoted at 108 are movable arms, and denoted at 119 is an actuator which operates to move the arms 108 upwardly and downwardly. An end of each arm 108 is coupled to a base 105, such that the base 105 and the mirror 104 are supported by the arms 108.

In this example, the substrate 103 of the mirror 104 has a convex shape quadratically curved surface (cylindrical surface) having a very large curvature radius R, and a multilayered film 102 is formed on this surface. Basically, the film 102 has a similar multilayered structure as that of the mirror 104 of FIG. 2, and the thickness of each layer increases with an increase in the distance from the radiation source 1 (FIG. 1).

In this example, the mirror 104 is oscillatingly moved upwardly and downwardly so as to traverse the path of the X-ray beam 101, by means of the actuator 119 and the arms 108. As a result, the mirror 104 scans the X-ray beam while reflecting the same. Thus, the mirror 104 produces a diffused reflection beam (X-ray beam).

The scan and diffusion device 2 may be modified in a manner, different from those shown in FIGS. 2 and 3. As an example, a convex mirror such as shown in FIG. 3 may be mounted to the support 105 of FIG. 2, such that the mirror may be moved along an arcuate path.

A practical example of reflection mirror 104 which may have a flat or convex reflection surface will now be explained.

A silica substrate 103 having its surface finished by lapping to an order of a flatness $\lambda/20$ ($\lambda = 6328$ Å) and a surface roughness 4.6 Årms and having a size $40 \times 40 \times 15$ (mm) may be used. On such a substrate, four layers of ruthenium (Ru) and three layers of aluminum (Al) may be alternately accumulated in accordance with the ion sputtering method, to provide a multilayered film 102 with a total of seven layers. The thickness of each layer may be continuously changed rectilinearly, in accordance with the aforementioned shutter control method. For the ruthenium layer, it may have a thickness changing from 17.2 Å to 51.4 Å. For the aluminum layer, it may have a thickness changing from 7.8 Å to 78.9 Å. In the shutter control method, a rectangular shutter may be provided before the substrate 103 and may be moved at a constant speed in a horizontal direction along the surface of the substrate.

Figure 4:
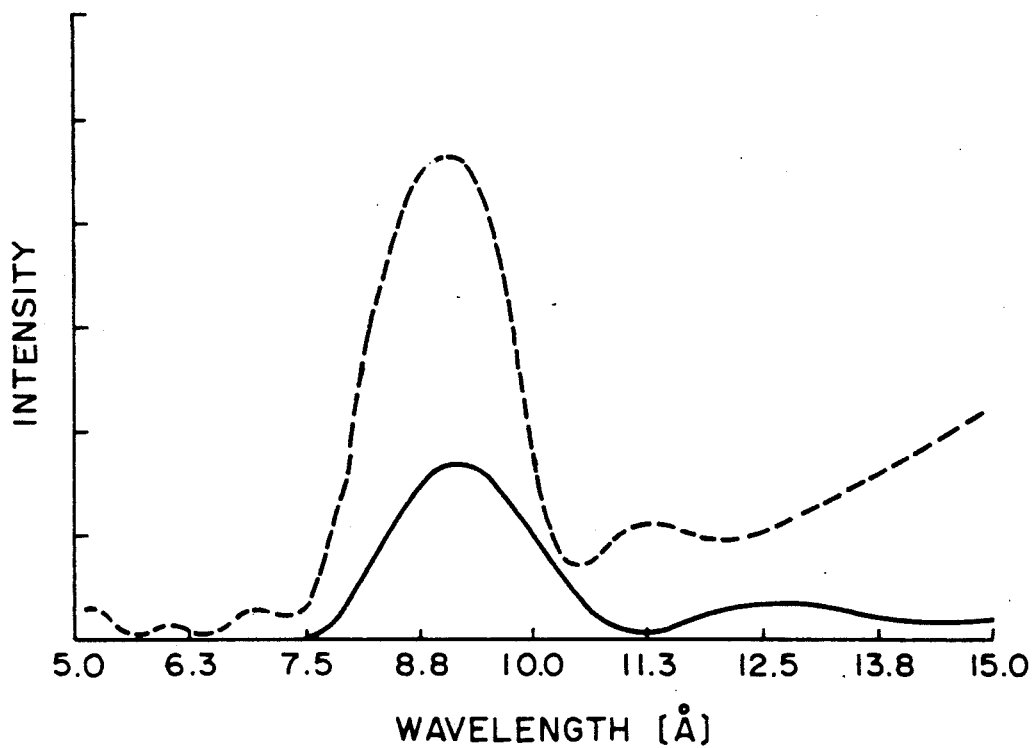
FIG. 4 is a graph showing a wavelength spectrum at opposite ends with respect to a scan direction, when a certain surface is scanned by using a scanning system according to the present invention.

Assuming that such a mirror 104 was disposed in a mirror chamber, simulations were made on the assumption that the mirror was swung along an arcuate path with a rotational radius of 1 m; a beam of X-rays from a synchrotron orbit radiation (SOR) source was inputted
to the mirror; the angle of swinging movement was ±0.86 deg.; the X-ray beam had an angle of incidence of 4 deg. upon the mirror as the mirror's angular position was zero (0) deg.; and the point of measurement for measuring the produced reflection beam (X-ray beam) was set at a distance of 1 m from the mirror 104. From the results, it has been confirmed that the input X-ray beam having a vertical expansion of 5. mm just before the mirror 104 can be expanded and projected to illuminate an illumination zone of 30 mm. Also, it has been confirmed that the center wavelength of the projected X-ray beam can be maintained substantially at 9 Å, at each of the upper edge, the center and the lower edge of the illumination zone, and that throughout the zone the variation of wavelength can be suppressed sufficiently. FIG. 4 illustrates an exemplary wavelength distribution at the upper edge (solid line) and that at the lower edge (broken line) of the illumination zone.

Figure 5:
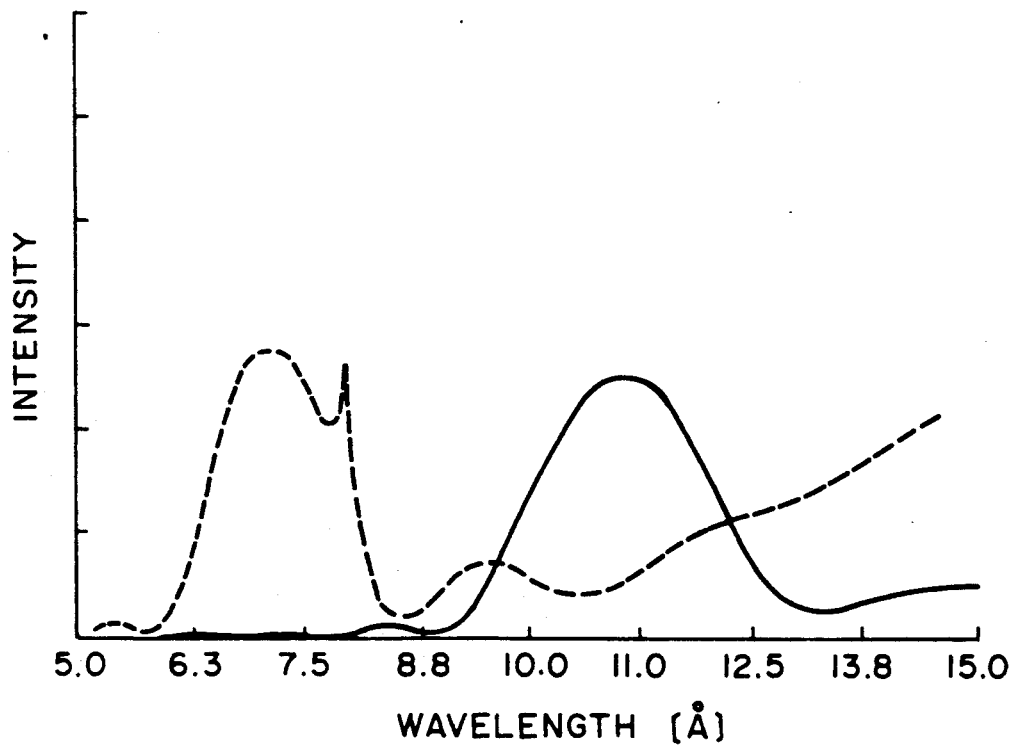
FIG. 5 is a graph similar to FIG. 4, but the surface is scanned by swinging a mirror with a multilayered film whose layers have a uniform thickness throughout the entire reflection surface.

As a comparative example, similar simulations were made on the assumption that a multilayered film having an optimized design with respect to light of 9 Å was formed on a substrate with a uniform layer thickness; the substrate was made of silica; each ruthenium layer had a uniform thickness of 33.8 Å throughout the substrate surface; each aluminum layer had a uniform thickness of 38.9 Å throughout the substrate surface; and the total number of the layers and the angle of swinging movement of the mirror as well as the angle of incidence of the input X-ray beam were the same as those of the simulations made with regard to the mirror of the present invention. From the results, it has been confirmed that, although a similar illumination zone of 30 mm can be obtained at a distance of 1 m from the mirror, the center wavelength of the X-ray beam is 11 Å at the upper edge of the zone and 7 Å at the lower edge of the zone, and that there is produced non-uniformness of wavelength of about 4 Å throughout the illumination zone. FIG. 5 shows an exemplary wavelength distribution at the upper edge (solid line) and that at the lower edge (broken line) when such a multilayered film with a uniform layer thickness is used.

Another practical example of a reflection mirror of the present invention will now be explained.

A silica substrate 103 having a cylindrical surface finished by lapping to an order of surface precision $\lambda/10$ and surface roughness 5.0 Årms and having a size $350 \times 80 \times 50$ (mm) and a radius R=50 m, may be used. On this cylindrical surface, eight layers of ruthenium (Ru) and seven layers of aluminum (Al) may be accumulated alternately in accordance with the high frequency magnetron sputtering method, to provide a multilayered film 102 with a total of fifteen layers. The thickness of each layer may be changed continuously from one end to the other end, in accordance with the shutter control method described hereinbefore. Within a range of ±35 mm about the center (peak) of the substrate 103 and along an arcuate (cylindrical surface), each ruthenium layer may have a thickness changing from 15.0 Å to 35.5 Å (from one end to the other end), while each aluminum layer may have a thickness changing from 9.5 Å to 106.5 Å.

Assuming that such a convex mirror 104 was disposed in a mirror chamber, simulations were made on the assumption that the mirror was swung along an arcuate path with a rotational radius of 1 m; a beam of X-rays from a synchrotron orbit radiation (SOR) source was inputted to the mirror; the angle of swinging movement was ±0.86 deg.; the X-ray beam had an angle of incidence of 5 deg. upon center (peak) of the mirror as the mirror's angular position was zero (0) deg.; and the point of measurement for measuring the produced reflection beam (X-ray beam) was set at a distance of 1 m from the mirror 104. From the results, it has been confirmed that the input X-ray beam having a vertical expansion of 5 mm just before the mirror 104 can be expanded and projected to illuminate an illumination zone of 93 mm. Also, it has been confirmed that the center wavelength of the projected X-ray beam can be maintained substantially at 10 Å, at each of the upper and lower edges of the illumination zone, and that throughout the zone the variation of wavelength can be suppressed sufficiently.

It will be understood from the foregoing description that the reflection mirror of the present invention has an advantage that the produced reflection beam has small non-uniformness of wavelength, in addition to the advantage of transforming light of a small divergent angle into light of sufficient expansion to illuminate a wide zone.

When such a mirror is used in an X-ray exposure apparatus, for example, it is possible to avoid or reduce the correction of non-uniform exposure dependent upon the spectral sensitivity of a resist used and, therefore, there is no necessity for complicated apparatus for correction based on characteristics of individual resist materials. Also, when such a mirror is used, uniform exposure of a resist on a wafer is easily attainable even in a case when the illuminance in the exposure region is not uniform, by setting the exposure time periods different to different portions of the exposure region in accordance with the non-uniformness in illuminance. For this exposure control, a known method such as discussed in a paper "Summary of Society of Japanese Applied Physics, 1988, Spring, 31a-k-9", by Nihon Denki Kabushiki Kaisha, may be used. While on that occasion it is necessary to measure the strength of the illumination light by some means, the strength of the illumination light should correspond to the absorption characteristics (wavelength dependence) of the resist used.

On the other hand, recently, attention has been paid to the damage by radiation of a radiation optical element. Since in the arrangement shown in FIGS. 1, 2 or 3 the mirror 104 is swingingly or oscillatingly moved, the position of incidence of the radiation upon the mirror changes with time. Therefore, the possibility of local damage of the mirror surface is very small. Further, by appropriately selecting the shape of the mirror reflection surface or the angle of swinging movement, for example, it is possible to adjust easily the distance or the angle of view and, by appropriately selecting the materials, the number of layers, the layer thickness or the layer thickness distribution, for example, of the multilayered film, it is possible to obtain easily a desired wavelength distribution.

In another aspect, the present invention is applicable to a reflection mirror which is to be fixedly secured. When such a mirror is to be used in an exposure apparatus, preferably it may have a convex reflection surface. A multilayered film may be formed on the convex reflection surface, each layer having a thickness changing with position on the reflection surface. This is effective to suppress non-uniformness in wavelength of a produced reflection beam from the reflection surface, resulting from different angles of incidence of different portions of an input radiation beam, impinging upon different positions of the reflection surface of the mirror. Accordingly, it is possible to obtain easily a reflection beam having sufficient expansion and sufficiently reduced non-uniformness in wavelength.

The radiation beam to be used in the present invention is not limited to X-rays or vacuum ultraviolet rays. For the reflection of ultraviolet rays, visible rays or infrared rays of a wavelength of 200 nm or larger, for example, the present invention can be used. The present invention is particularly effective, when it is used with a radiation beam having a relatively wide bandwidth.

While the invention has been described with reference to the structures disclosed herein, it is not confined to the details set forth and this application is intended to cover such modifications or changes as may come within the purposes of the improvements or the scope of the following claims.

What is claimed is:

1. An X-ray exposure apparatus, comprising:
   an X-ray source; and
   an illumination system for illuminating a mask pattern with X-rays from said X-ray source to expose a wafer to the mask pattern;
   wherein said illumination system includes a reflection mirror for reflecting the X-rays from said X-ray source to produce a reflection beam and a driving device for swinging said reflection mirror;
   wherein said reflection mirror has a reflection surface disposed so that the X-rays are grazingly inputted thereto;
   wherein said reflection surface has a multilayered film effective to provide an increased relative reflectivity with respect to a predetermined wavelength of the reflection beam;
   wherein each layer of said multilayered film of said reflection mirror has a thickness which gradually increases with an increase in a distance from said radiation beam in a plane of incidence of the X-rays; and
   wherein said driving device swings said reflection mirror so as to shift a position and an angle of incidence of the X-rays upon said reflection mirror in the plane of incidence, to thereby scanningly deflect the reflection beam to scan the mask pattern with the deflected reflection beam.

2. A reflection device including a movable mirror for reflecting a received radiation beam to produce a reflection beam, wherein said movable mirror is so moved that, with respect to a plane of incidence of the radiation beam, a position and an angle of incidence of the radiation beam are shifted with the movement of said movable mirror, characterized in that:
   said movable mirror has a multilayered film effective to provide an increased relative reflectivity of a predetermined wavelength of the reflection beam, wherein each layer of said multilayered film has a thickness which changes with position so as to substantially avoid a shift of said wavelength with the shift in the angle of incidence of the radiation beam.

3. A scanning system, comprising:
   a radiation source;
   a reflection mirror for reflecting a radiation beam from said radiation source to produce a reflection beam, said reflection mirror having a multilayered film effective to provide an increased relative reflectivity with respect to a predetermined wavelength of the reflection beam, wherein a layer of said multilayered film has a thickness which gradually increases with an increase in a distance from said radiation source in a plane of incidence of the radiation beam; and
   a driving device for swinging said reflection mirror so as to shift a position and an angle of incidence of the radiation beam upon said reflection mirror, in the plane of incidence of the radiation beam, to thereby scanningly deflect the reflection beam.

4. A scanning system according to claim 3, wherein said reflection mirror is disposed so that the radiation beam from said radiation source is grazingly inputted to said reflection mirror.

5. A scanning system according to claim 3, wherein said reflection mirror has a flat reflection surface and wherein said driving device rotationally moves said reflection mirror through a rotational shaft spaced from said reflection surface.

6. A scanning system according to claim 4, wherein said reflection mirror has a flat reflection surface and wherein said driving device rotationally moves said reflection mirror through a rotational shaft spaced from said reflection surface.

7. A scanning system according to claim 3, wherein said reflection mirror has a convex reflection surface and wherein said driving device rotationally moves said reflection mirror through a rotational shaft spaced from said reflection surface.

8. A scanning system according to claim 4, wherein said reflection mirror has a convex reflection surface and wherein said driving device rotationally moves said reflection mirror through a rotational shaft spaced from said reflection surface.

9. A scanning system according to claim 3, wherein said reflection mirror has a convex reflection surface and wherein said driving device oscillatingly moves said reflection mirror rectilinearly in a direction traversing the radiation beam.

10. A scanning system according to claim 4, wherein said reflection mirror has a convex reflection surface and wherein said driving device oscillatingly moves said reflection mirror rectilinearly in a direction traversing the radiation beam.

11. An X-ray exposure apparatus, comprising:
    an X-ray source; and
    an illumination system for illuminating a mask pattern with X-rays from said X-ray source to expose a wafer to the mask pattern;
    wherein said illumination system includes a reflection mirror for reflecting the X-rays from said X-ray source to produce a reflection beam and a driving device for swinging said reflection mirror;
    wherein said reflection mirror has a multilayered film effective to provide an increased relative reflectivity with respect to a predetermined wavelength of the reflection beam;
    wherein each layer of said multilayered film of said reflection mirror has a thickness which gradually increases with an increase in a distance from said X-ray source in a plane of incidence of the X-rays; and
    wherein said driving device swings said reflection mirror so as to shift a position and an angle of incidence of the X-rays upon said reflection mirror in the plane of incidence, to thereby scanningly deflect the reflection beam to scan the mask pattern with the deflected reflection beam.

12. An apparatus according to claim 11, wherein said reflection mirror is disposed so that the X-rays from said X-ray source are grazingly inputted to said reflection mirror.

13. An apparatus according to claim 11, wherein said reflection mirror has a flat reflection surface and wherein said driving device rotationally moves said reflection mirror through a rotational shaft spaced from said reflection surface.

14. An apparatus according to claim 12, wherein said reflection mirror has a flat reflection surface and wherein said driving device rotationally moves said reflection mirror through a rotational shaft spaced from said reflection surface.

15. An apparatus according to claim 11, wherein said reflection mirror has a convex reflection surface and wherein said driving device rotationally moves said reflection mirror through a rotational shaft spaced from said reflection surface.

16. An apparatus according to claim 12, wherein said reflection mirror has a convex reflection surface and wherein said driving device rotationally moves said reflection mirror through a rotational shaft spaced from said reflection surface.

17. An exposure apparatus according to claim 11, wherein said reflection mirror has a convex reflection surface and wherein said driving device oscillatingly moves said reflection mirror rectilinearly in a direction traversing the X-rays.

18. An exposure apparatus according to claim 12, wherein said reflection mirror has a convex reflection surface and wherein said driving device oscillatingly moves said reflection mirror rectilinearly in a direction traversing the X-rays.

19. A scanning system, comprising:
   a radiation source;
   a reflection mirror for reflecting a radiation beam from said radiation source to produce a reflection beam, said reflection mirror being disposed so that the radiation beam is grazingly inputted thereto, and said reflection mirror having a multilayered film effective to provide an increased relative reflectivity with respect to a predetermined wavelength of the reflection beam, wherein each layer of said multilayered film has a thickness which increases with an increase in a distance from said radiation source in a plane of incidence of the radiation beam; and
   a driving device for swinging said reflection mirror so as to shift a position and an angle of incidence of the radiation beam upon said reflection mirror, in the plane of incidence of the radiation beam, to thereby scanningly deflect the reflection beam.

20. An exposure apparatus for exposing a wafer to a mask with a radiation beam from a radiation source, said apparatus comprising:
   mask holding means for holding the mask;
   wafer holding means for holding the wafer; and
   an illumination system for illuminating a circuit pattern of the mask with the radiation beam from said radiation source to thereby expose the wafer to the circuit pattern of the mask with the radiation beam, said illumination system comprising a scanning mirror for reflecting the radiation beam to the mask, said scanning mirror having a multilayered film formed thereon and being movable to change the position and angle of incidence of the radiation beam upon said scanning mirror,
   wherein said multilayered film of said scanning mirror provides increased reflectivity to a portion of the radiation beam having a particular wavelength and wherein each layer of said multilayered film has a thickness which changes with the position thereon so as to substantially compensate for a change in the particular wavelength resulting from a change in the angle of incidence of the radiation beam.

21. An apparatus according to claim 20, wherein said radiation source comprises an X-ray source.

22. An apparatus according to claim 21, wherein said scanning mirror has a flat reflection surface for reflecting the radiation beam, and wherein said scanning mirror is swingingly movable to change the position and angle of incidence of the radiation beam upon the flat reflection surface.

23. An apparatus according to claim 21, wherein said scanning mirror has a reflection surface of convex shape for reflecting the radiation beam, and wherein said scanning mirror is swingingly movable to change the position and angle of incidence of the radiation beam upon the reflection surface.

24. An apparatus according to claim 21, wherein said scanning mirror has a reflection surface of convex shape for reflecting the radiation beam, and wherein said scanning mirror is rectilinearly movable to change the position and angle of incidence of the radiation beam upon the flat reflection surface.

25. An apparatus according to claim 20, wherein the radiation beam from said radiation source is projected obliquely upon said scanning mirror and wherein said scanning mirror is movable along a plane of incidence of the radiation beam.

26. An X-ray exposure apparatus for exposing a wafer to a mask with a radiation beam from an X-ray source, said apparatus comprising:
   mask holding means for holding the mask;
   wafer holding means for holding the wafer; and
   an illumination system for illuminating a circuit pattern of the mask with the radiation beam from said X-ray source to thereby expose the wafer to the circuit pattern of the mask with the radiation beam, said illumination system comprising a scanning mirror for reflecting the radiation beam to the mask, said scanning mirror having a multilayered film formed thereon and being movable along a plane of incidence of the radiation beam to change the position and angle of incidence of the radiation beam upon said scanning mirror,
   wherein said multilayered film of said scanning mirror provides an increased reflectivity to a portion of the radiation beam having a particular wavelength and wherein each layer of said multilayered film has a thickness which gradually increases along the plane of incidence and in a direction from said X-ray source to the mask so as to substantially compensate for any change in the particular wavelength resulting from a change in the angle of incidence of the radiation beam.

27. An apparatus according to claim 26, wherein said scanning mirror has a flat reflection surface for reflecting the radiation beam, and wherein said scanning mirror is swingingly movable to change the position and angle of incidence of the radiation beam upon the flat reflection surface.

28. An apparatus according to claim 26, wherein said scanning mirror has a reflection surface of convex shape for reflecting the radiation beam, and wherein said scanning mirror is swingingly movable to change the position and angle of incidence of the radiation beam upon the reflection surface.

29. An apparatus according to claim 26, wherein said scanning mirror has a reflection surface of convex shape for reflecting the radiation beam, and wherein said scanning mirror is rectilinearly movable to change the position and angle of incidence of the radiation beam upon the flat reflection surface.

30. In a semiconductor device manufacturing method wherein a mask is scanningly illuminated with a radiation beam emanating from a radiation source and reflected by a scanning mirror to print a circuit pattern of the mask on a wafer with the radiation beam, the improvement comprising:
  moving the scanning mirror to change the position and angle of incidence of the radiation beam upon the scanning mirror;
  providing a multilayered film on the scanning mirror for increased reflectivity with respect to a particular wavelength component of the radiation beam; and
  providing each layer of the multilayered film with a thickness which changes with the position thereon so as to substantially compensate for any change in the particular wavelength resulting from a change in the angle of incidence of the radiation beam.

31. A method according to claim 30, further comprising providing the scanning mirror with a flat reflection surface.

32. A method according to claim 30, further comprising providing the scanning mirror with a reflection surface of convex shape.

* * * * *

UNITED STATES PATENT AND TRADEMARK OFFICE
CERTIFICATE OF CORRECTION

PATENT NO. : 5,182,763
DATED : January 26, 1993
INVENTOR(S) : Takashi Iizuka, et al.

It is certified that error appears in the above-identified patent and that said Letters Patent is hereby corrected as shown below:

On the title page

UNDER "U.S. PATENT DOCUMENTS"

"Wittny" should read --Wittry--.

COLUMN 1

Line 54, "wavelength" should read --wavelengths--. (1st occur.)

COLUMN 2

Line 6, "presents" should read --prevents--.

COLUMN 6

Line 53, "ted" should read --ted to the mirror; the angle of swinging movement--; and
Line 54, should be deleted.

Signed and Sealed this

Fourth Day of January, 1994

Attest:

BRUCE LEHMAN

Attesting Officer     Commissioner of Patents and Trademarks